(12) United States Patent
Höreth

(10) Patent No.: US 6,960,930 B2
(45) Date of Patent: Nov. 1, 2005

(54) METHOD AND APPARATUS FOR DETERMINING THE MINIMUM OR MAXIMUM SWITCHING ACTIVITY OF A DIGITAL CIRCUIT

(75) Inventor: Stefan Höreth, Glonn (DE)

(73) Assignee: Infineon Technologies AG, Munich (DE)

( * ) Notice: Subject to any disclaimer, the term of this patent is extended or adjusted under 35 U.S.C. 154(b) by 150 days.

(21) Appl. No.: 10/719,818

(22) Filed: Nov. 21, 2003

(65) Prior Publication Data

US 2004/0117699 A1    Jun. 17, 2004

(30) Foreign Application Priority Data

Nov. 28, 2002 (DE) .................................. 02026498

(51) Int. Cl.[7] ......................................... H03K 19/007
(52) U.S. Cl. ............................. 326/14; 326/26; 716/1; 713/320
(58) Field of Search .............................. 326/9, 14, 21, 326/26–28, 31–34; 713/300, 320; 716/1

(56) References Cited

U.S. PATENT DOCUMENTS

| | | | | |
|---|---|---|---|---|
| 6,105,139 A | * | 8/2000 | Dey et al. .................... | 713/300 |
| 6,185,719 B1 | * | 2/2001 | Sako ............................ | 716/1 |
| 6,625,781 B2 | * | 9/2003 | Roethig et al. .............. | 716/1 |

OTHER PUBLICATIONS

Satyanarayana J.J. et al, "Systematic Analysis of Bounds on Power Consumption in Pipelined and Non-Pipelined Multipliers", IEEE Computer Society Press, Oct. 7, 1996, pp. 492-499.

Bobba S., et al. "Estimation of Maximum Switching Activity in Digital VLSI Circuits"IEEE Aug. 3, 1997, pp. 1130-1133.

Bhanja S., et al. "Switching Activity Estimation of Large Circuits Using Multiple Bayesian Networks", Proceedings of the 15th International Conference on VLSI Design. IEEE Computer Society pp. 187-192.

* cited by examiner

*Primary Examiner*—James H. Cho
(74) *Attorney, Agent, or Firm*—Peter F. Corless; Steven M. Jensen; Edwards & Angell, LLP

(57) ABSTRACT

In order when designing a digital circuit to be able to determine the minimum or maximum switching activity for estimating the power consumption it is determined according to the invention on the basis of a model of the digital circuit whether there is a disproving operational case, in which the switching activity is less than an estimated value (k) for the minimum switching activity or greater than an estimated value (k) for the maximum switching activity. If the existence of an appropriate disproving operational case (P(k)) can be found, when determining the maximum switching activity the estimated value (k) is increased by one step size and when determining the minimum switching activity the estimated value (k) reduces. After a decrease or increase of the estimated value (k) the process is repeated and in this way the actual value for the maximum or minimum switching activity of the digital circuit is determined iteratively. After an appropriate interruption condition the currently used estimated value (k) is employed as the measure for the minimum or maximum switching activity. Based on the minimum or maximum switching activity on the one hand the minimum or maximum power consumption of the digital circuit can be determined or on the other hand further diagnostic functions can be carried out.

10 Claims, 1 Drawing Sheet

METHOD AND APPARATUS FOR DETERMINING THE MINIMUM OR MAXIMUM SWITCHING ACTIVITY OF A DIGITAL CIRCUIT

The following invention relates to a method or apparatus for determining a minimum or maximum switching activity of a digital circuit on the basis of a functional model of the digital circuit, as well as a digital memory device with control signals to implement the method by means of a data processor.

More and more importance is attached to the development of low power dissipation digital signals. Already today the operation of mobile terminals such as mobile telephones or portable computer systems, for example, would not be possible without the use of means to reduce power consumption. The power consumption of a digital system or a digital circuit is governed to a large extent by the switching activity of the digital circuit. To design digital circuits with minimum power consumption, precise statements about maximum or minimum power consumption are indispensable. An essential goal in the design of such circuits apart from functional correctness is also to meet the prescribed standards for power consumption.

To estimate power consumption or switching activity, it is known in the case of conventional methods to apply on the digital circuit test vectors specified by the user, whereby the meaningfulness of the resultant estimation of power consumption or switching activity substantially depends on the quality of the test vectors specified. This procedure is therefore prone to error and can lead to unacceptably optimistic estimations of power consumption, which in practice has disadvantageous consequences and can even lead to the failure of the system.

A corresponding method is known from EP 863 470 A1, in which a method for producing the function of the power consumption of a functional model of a digital circuit is described, with which method a circuit description is produced, by which the power consumption can be determined. This circuit description is submitted to a simulation, in which input samples are used, in order to determine the function of the power consumption. Disadvantageously, the results obtained for power consumption largely depend on the test samples or input samples used. The quality of the power consumption estimation is therefore essentially determined by the skill in selecting the test samples, so that if the test samples are not selected favourably, the power consumption estimation is inaccurate.

The object of the present invention is therefore to create a method and an apparatus equipped for implementing the method as well as a digital memory device with control statements to implement the method by using it with a programmable data processor, with which on the basis of a description of a digital circuit its minimum or maximum switching activity can be reliably determined.

This object is achieved according to the invention by a method with the features of claim 1 or an apparatus with the features of claim 9 or a memory device with the features of claim 11. The dependent claims in each case define preferred and advantageous embodiments of the present invention.

According to the invention, the minimum or maximum switching activity of a digital circuit on the basis of its model is determined iteratively in steps, whereby firstly at each step an estimated value is defined for the minimum or maximum switching activity and subsequently it is verified whether the estimated value for the minimum or maximum switching activity can in fact be an extreme value. This verification is performed according to the invention through the attempt to find a counter proof, in which a search is made for an operational case, where the switching activity of the digital circuit is greater or lesser than the originally accepted estimated value for the maximum or minimum switching activity of the digital circuit. The procedure for this counter proof consists in the attempt to find an operational case, which disproves the originally concluded acceptance that the estimated value for the maximum or minimum switching activity was in fact an extreme value.

If a disproving operational case can be found, which refutes the original acceptance, the originally accepted estimated value is increased or decreased at the next iteration step, in order to come closer to the actual value for the maximum or minimum switching activity of the digital circuit. Whenever a search is made for the maximum switching activity, the verification looks for a disproving operational case, in which the switching activity is greater than the estimated value at the particular step and the estimated value is increased at the next step, if a disproving operational case can be found or however a switching activity of the digital circuit higher than the originally accepted estimated value must still be possible and the estimated value is decreased, if no disproving operational case can be found.

On the other hand, if a search is made for the minimum switching activity of the digital circuit, the verification looks for a disproving operational case, in which the switching activity of the digital circuit is less than the estimated value at the particular step. If such a disproving operational case is found, the estimated value is further decreased at the next iteration step and if no disproving operational case is found, the estimated value is increased at the next step.

The switching activity of the digital circuit in this case can be advantageously defined as the number of elements within the digital circuit, which can store a logic state and which change their condition within a time base to be selected. Such circuit elements, which can store a logic state, are in particular trigger circuits, such as, for example, flip-flops. As a time base in particular a clock of the digital circuit can be used, whereby preferably in the case of each clock a change of the logic state of each flip-flop or memory element should be possible. The switching activity can thus be expressed as a whole number, which is related to a time base, whereby the time base is usually a clock cycle, so that the switching activity is a simple whole number.

Advantageously, the estimated value is increased or decreased from one iteration step to the next by one step size, which always reduces from iteration step to iteration step. In this way, during the course of the iteration the estimated value for the maximum or minimum switching activity more and more approaches the particular actual value. In this case, the step size can be reduced from each iteration step to the next in various ways. It is possible in each case to halve the step size at the next iteration step or divide this by a specific factor. In addition, the step size in the case of an increase can also be dimensioned differently than in the case of a decrease. In addition for the estimated value and in particular for the step size in order to increase or decrease the estimated value not an absolute value can be used, but part of a reference quantity, which advantageously corresponds to the theoretically maximum possible switching activity of the digital circuit. This theoretical maximum value, which is to be used as a reference quantity is in particular the number of flip-flops within the digital circuit. In this case, all circuit elements, which can store a logic condition, are to be included in the number of flip-flops.

If the number of flip-flops is used as the theoretical maximum value for the switching activity, this preferably only applies if a clock cycle of the digital circuit is used as the time basis. However, a multiple of the number of flip-flops within the digital circuit can also be used as the theoretical maximum value for the switching activity, if a multiple of clock cycles of the digital circuit is equally used as the time basis.

Verification or finding of a disproving operational case necessary to implement the theory according to the invention can be performed in various ways. In particular, the verification is conducted by creating one or several logic functions on the basis of the model of the digital circuit, which describe the logic state in some or all switching elements occurring within the digital circuit dependent on an operational case. Generally, the sum of the circumstances, which reproducibly lead to a specific state of the digital circuit, is understood as an operational case. An operational case in particular includes a specific pattern of input quantities and the temporal output state of the digital circuit, provided this determines the behaviour of the digital circuit. A goal of verification is to find the disproving operational case as quickly as possible. Since digital circuits are becoming more and more extensive, a simple check of all possible operating cases results in finding a disproving operational case only by spending a long amount of time. Therefore, it is known to use different strategies in order to obtain proof as to whether there is at least one disproving operational case, whereby it is only of significance whether there is at least one such disproving operational case. The way in which such an actual disproving operational case appears is of no fundamental importance for the invention.

During verification, the at least one logical function, which describes the behaviour of the digital circuit can be analyzed beforehand, in order to define a success-likely strategy, according to which various operational cases or groups of similarly effective operational cases are tested. Apart from this, it is also conceivable to use verification methods, in which no simulation of the digital circuit or application of the at least one logical function is necessary for a limited group of operational cases, but it is solely decided by formal analysis of the model for the digital circuit, whether there can be or there is a disproving operational case or there cannot be or there is not.

The method according to the invention can be implemented on the basis of a circuit description, which can be synthesized, or a formal characteristic suite. A characteristic suite is a set of characteristics, which are formulated in a formal characteristic language, such as, for example, Sugar or System Verilog Assertions. If a characteristic suite or a set of characteristics is used to implement the method according to the invention, the selection of the formal characteristics within the characteristic suite can be limited during verification. Thus it is possible during checking only to consider some of the formal characteristics in order to limit the investigation for example to relevant operational cases, more particularly occurring in practice. This is possible in particular if the use of the digital circuit in the proposed environment results in the fact that certain operational cases or groups of operational cases are ruled out from the very beginning.

At the start of the method, the estimated value is defined without prior verification, whereby the estimated value initially defined is preferably laid down dependent on the theoretical maximum value for the switching activity. This maximum value is in particular, as stated above, the number of flip-flops within the digital circuit. The initial estimated value can, for example, be a defined percentage of the theoretical maximum switching activity.

The iteration is terminated dependent on a termination criterion and the estimated value used at this point in time is employed as the value for the maximum or minimum switching activity. As termination criterion for the iteration various factors come into consideration. On the one hand, the iteration can be terminated as soon as the step size reaches a certain minimum value during step-by-step reduction. This minimum value then represents the upper limit for the error when determining the minimum or maximum switching activity. In particular, the minimum value is selected so that it is below a required precision for determining the minimum and maximum switching activity.

Furthermore, the iteration can be terminated after a certain number of iteration steps.

In an advantageous refinement at the end of the iteration the disproving operational case last identified as existing is determined in order to find an operational case, which results in an at least essentially maximum or minimum switching activity within the digital circuit. This disproving operational case, which can be considered a test pattern can be used for further different checks. On the one hand, the disproving operational case can be used in order to determine the minimum or maximum power consumption on the basis of a suitable model for the digital circuit. For this purpose, a process or computer program can be used, other than the one used for verification. Equally in this case, under certain circumstances a model of the digital circuit may be necessary, other than the one used for verification.

Furthermore, the disproving operational case can also be used to change the design of the digital circuit in order more particularly to reduce the maximum switching activity of the digital circuit.

In an advantageous embodiment, a disproving operational case is used to determine a coverage, which represents the number of elements within the digital circuit, that were relevant or had influence on the checking. This coverage is always related to at least one formal characteristic of the digital circuit, the maintenance of which was the basis of the checking or verification. Consequently, the coverage can be computed both in relation to the search for the minimum switching activity as well as for the maximum switching activity and in addition for various formal characteristics of the digital circuit or combinations of formal characteristics. The coverage may be used for diagnostic purposes of the digital circuit. In this case, the coverage cannot only indicate the amount of the elements paramount for checking, but under certain circumstances those elements of the digital circuit, which were paramount for checking. In this way, dead paths within the digital circuit, which do not contribute to fulfilling the necessary formal characteristics, can be identified, for example.

The method according to the invention can in particular be implemented in a data processor such as a programmable computer system, whereby the invention can also be implemented in a data carrier with suitable control statements, the control statements being set up in such a manner that a correspondingly equipped programmable data processor implements the method according to the invention after inputting the control statements.

The invention is explained in detail below on the basis of a preferred embodiment with reference to the appended drawing.

With the embodiment described below the minimum and maximum switching activity of a digital circuit is determined in accordance with the method according to the invention, whereby the digital circuit is presented in the form of a functional model, with which a set of characteristics is defined, which the digital circuit fulfills. In the following, the letter k is used to designate the switching activity, the estimated value for the switching activity and the value for the switching activity obtained at the end of the process not being designated differently. The designation P (k) is used in the following in order to mark the at least one disproving operational case, which at least essentially results in a certain switching activity k.

Figure 1:
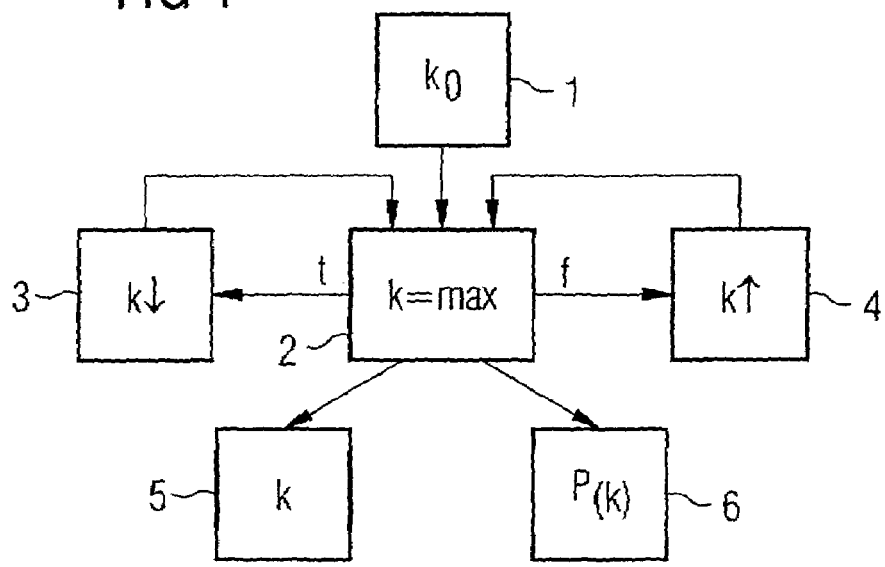
FIG. 1 is a schematic block diagram of the process steps for determining the maximum switching activity.

With regard to determining the maximum switching activity represented in FIG. 1 the process begins with block 1, in which an initial value $k_0$ is specified as an estimated value of the switching activity. Block 1 is followed by block 2, which contains a verification as to whether the current estimated value k can in fact be the maximum value for the switching activity or whether a disproving operational case can be found, which disproves the acceptance that the present estimated value k can in fact be the maximum value. If a disproving operational case is found and the acceptance was false, the process jumps to block 4, in which the estimated value k is increased by one step size. If the acceptance was true and no disproving operational case could be found it jumps to block 3, in which the estimated value k is reduced by one step size. Both the step size used in block 3 and the step size used in block 4 reduces with every process step. Within the inquiry in block 2 a check is also implemented as to whether the number of iteration steps already carried out has reached a maximum number. If the number of the iteration steps has reached the maximum number, the verification block 2 terminates the iteration and jumps to the two blocks 5 and 6, in which on the one hand in block 5 the current estimated value k is defined as the value for the maximum switching activity of the digital circuit and in which on the other hand in block 6 the operational case P(k) last determined as existing is identified and output. This last disproving operational case P(k) is used in further (not represented) process steps either for diagnostic purposes or to compute the actual power consumption with maximum switching activity. Here, it is noted that although the maximum power consumption of a digital circuit does not necessarily have to occur with the maximum switching activity, this assumption is normally correct.

Figure 2:
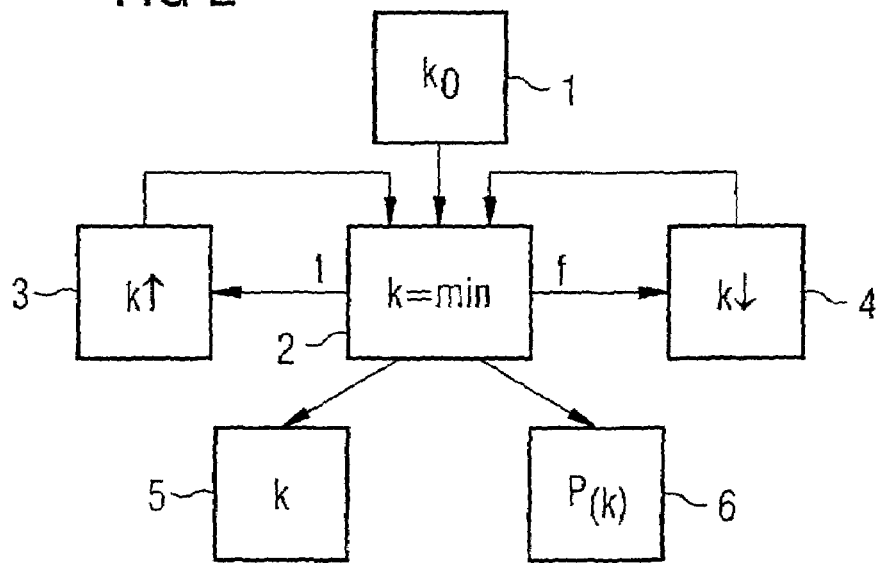
FIG. 2 is a schematic block diagram of the process steps for determining the minimum switching activity of a digital circuit.

FIG. 2 describes the execution of the method for determining the minimum switching activity. The blocks arising in FIG. 2 in the block diagram correspond to those from FIG. 1 and have been given the same reference symbols. In contrast to determination of the maximum switching activity in the case of the method represented in FIG. 2 with verification block 2 it is not determined whether the estimated value k could be the maximum, but whether it could be the minimum and for this reason attempt is made to find a disproving operational case with which the switching activity is even less. If it is determined that the acceptance is false and the existence of a suitable disproving operational case with less switching activity could be proven, the process jumps to block 4, in which the estimated value k is reduced by one step size and the verification is repeated in block 2. If vice-versa, the acceptance is true and the existence of a disproving operational case of less switching activity could not be proven, the process jumps to block 3, where the estimated value k is increased by one step size and the verification is repeated in block 2. Similarly as with determination of the maximum switching activity the iteration is interrupted after a certain maximum number of iteration steps and the process jumps to blocks 5 and 6, in which on the one hand the current estimated value is outputted as the value for the minimum switching activity and the disproving operational case P (k) last determined as existing is identified and outputted. As for determination of the maximum switching activity the disproving operational case P (k) is used for diagnostic purposes and for computing the minimum power consumption of the digital circuit.

The method according to the invention described in the present embodiment can be executed on a data processor especially set-up for this purpose or can be implemented in the form of a data processing program, which executes the method according to the invention in a programmable data processor.

I claim:

1. Method for determining a minimum or maximum switching activity of a digital circuit on the basis of a model of the digital circuit, with which method for determining the minimum switching activity a check is performed as to whether there is at least one disproving operational case of the digital circuit, in which the switching activity is less than an estimated value, and the check is repeated if there is a disproving operational case with an estimated value reduced by one step size and if there is no disproving operational case with an estimated value increased by one step size, or for determining the maximum switching activity a check is performed as to whether there is at least one disproving operational case of the digital circuit, in which the switching activity is greater than an estimated value and the check is repeated if there is a disproving operational case with an estimated value increased by one step size and if there is no disproving operational case with an estimated value reduced by one step size.

2. Method according to claim 1, wherein at the start the check is performed with an estimated value, which is dependent on the number of flip-flops within the digital circuit.

3. Method according to claim 1, wherein the step size reduces every time the check is repeated.

4. Method according to claim 3, wherein the method is terminated as soon as the step size has reached a minimum step size.

5. Method according to claim 1, wherein the method is terminated after a maximum number of repetitions.

6. Method according to claim 1, wherein at the end of the process the disproving operational case last determined as existing is determined and dependent on this disproving operational case the power consumption of the digital circuit with minimum or maximum switching activity is determined.

7. Method according to claim 1, wherein at the end of the process the disproving operational case last determined as existing is determined and dependent on this disproving operational case a measure for the number of the elements of the digital circuit is determined, which in this disproving operational case were involved in a verification of at least one switching characteristic.

8. Method according to claim 1, characterized in that when the check is performed only at least one switching characteristic needs to be fulfilled.

9. Apparatus for determining a minimum or maximum switching activity of a digital circuit on the basis of a model of the digital circuit with a data processor, which is equipped in such a manner that for determining the minimum switching activity it carries out a check as to whether there is at least one disproving operational case of the digital circuit, in which the proof activity is less than an estimated value and it repeats the check if there is a disproving operational case with an estimated value reduced by one step size and if there is no disproving operational case with an estimated value increased by one step size, or for determining the maximum switching activity carry out a check as to whether there is at least one disproving operational case of the digital circuit, in which the switching activity is greater than an estimated value, and repeats the check if there is a disproving operational case with an estimated value increased by one step size and if there is no disproving operational case with an estimated value reduced by one step size.

10. Digital memory device, with electronically selectable control signals, which can cooperate in such a way with a programmable computer system so that this implements a method for determining a minimum or maximum switching activity of a digital circuit on the basis of a model of the digital circuit, with which method for determining the minimum switching activity a check is performed as to whether there is at least one disproving operational case of the digital circuit, in which the switching activity is less than an estimated value, and the check is repeated if there is a disproving operational case with an estimated value reduced by one step size and if there is no disproving operational case with an estimated value increased by one step size, or for determining the maximum switching activity a check is performed as to whether there is at least one disproving operational case of the digital circuit, in which the switching activity is greater than an estimated value and the check is repeated if there is a disproving operational case with an estimated value increased by one step size and if there is no disproving operational case with an estimated value reduced by one step size.

* * * * *